United States Patent
Koseki et al.

(10) Patent No.: US 9,123,646 B2
(45) Date of Patent: Sep. 1, 2015

(54) LIGHT-EMITTING DEVICE

(71) Applicant: TOYODA GOSEI CO., LTD., Kiyosu-shi (JP)

(72) Inventors: Masakata Koseki, Kiyosu (JP); Yuichi Yano, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 13/892,101

(22) Filed: May 10, 2013

(65) Prior Publication Data
US 2013/0320391 A1     Dec. 5, 2013

(30) Foreign Application Priority Data

Jun. 4, 2012   (JP) .................. 2012-127410

(51) Int. Cl.
| | |
|---|---|
| H01L 33/00 | (2010.01) |
| H01L 23/29 | (2006.01) |
| H01L 33/56 | (2010.01) |
| C09D 183/04 | (2006.01) |
| C08G 77/00 | (2006.01) |

(52) U.S. Cl.
CPC ............ *H01L 23/293* (2013.01); *C09D 183/04* (2013.01); *H01L 33/56* (2013.01); *C08G 77/80* (2013.01); *H01L 2224/32245* (2013.01); *H01L 2224/48091* (2013.01); *H01L 2224/48247* (2013.01)

(58) Field of Classification Search
USPC ................... 257/100, 433, 787, 790, E51.02, 257/E33.059
See application file for complete search history.

(56) References Cited

U.S. PATENT DOCUMENTS

| | | | | |
|---|---|---|---|---|
| 5,523,363 A | * | 6/1996 | Fujibayashi et al. | 525/481 |
| 2009/0009046 A1 | * | 1/2009 | Oh et al. | 313/1 |
| 2010/0025709 A1 | * | 2/2010 | Koseki et al. | 257/98 |

FOREIGN PATENT DOCUMENTS

| | | |
|---|---|---|
| JP | 2007-184404 A | 7/2007 |
| JP | 2010-199229 A | 9/2010 |

* cited by examiner

*Primary Examiner* — Timor Karimy
(74) *Attorney, Agent, or Firm* — McGinn IP Law Group, PLLC

(57) ABSTRACT

A light-emitting device includes a light-emitting element, and a sealing material for sealing the light-emitting element. The sealing material includes a first layer including a radical polymerizable resin and a second layer including a non-radical polymerizable resin, the first layer being in contact with the light-emitting element and the second layer covering an upper surface of the first layer.

19 Claims, 1 Drawing Sheet

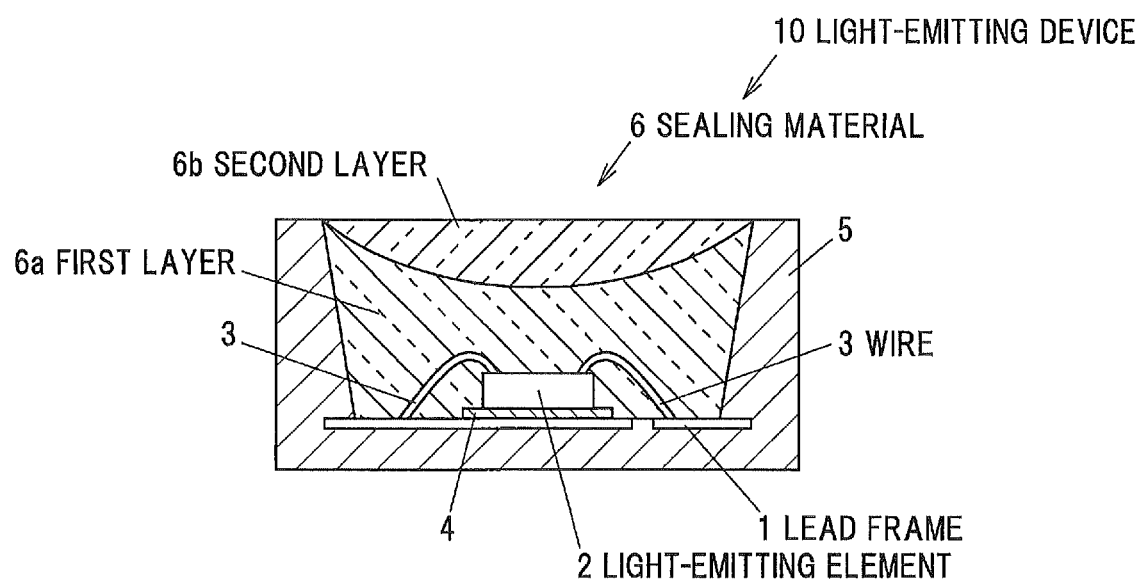

LIGHT-EMITTING DEVICE

The present application is based on Japanese patent application No. 2012-127410 filed on Jun. 4, 2012, the entire contents of which are incorporated herein by reference.

BACKGROUND OF THE INVENTION

1. Field of the Invention

The invention relates to a light-emitting device.

2. Related Art

A conventional light-emitting device is known that uses a thermosetting resin such as epoxy resin or silicone resin as a material for sealing a light-emitting element (see, e.g., JP-A-2010-199229).

In general, a thermosetting resin such as epoxy resin or silicone resin is poured into a recessed portion of a resin case having a light-emitting element placed therein and is then cured by heating. However, such a thermosetting resin has a disadvantage in that it is cured before being poured into the resin case during a manufacturing process since viscosity increases due to reaction which proceeds gradually even at room temperature and this produces a portion which has to be discarded. This increases a manufacturing cost of the sealing material, as a result.

On the other hand, a radical polymerizable resin, which is stable at room temperature and is instantaneously and progressively polymerized at a high temperature, is known. However, it is known that cure inhibition caused by oxygen is likely to occur on a surface of the radical polymerizable resin in contact with the air, which causes insufficient curing and likely causes tackiness (see, e.g., JP-A-2007-184404). Accordingly, in case that the radical polymerizable resin is used as a sealing material, there is a problem that it is necessary to eliminate oxygen by flowing an inert gas such as nitrogen gas into a hardening furnace and this increases the manufacturing cost.

SUMMARY OF THE INVENTION

It is an object of the invention to provide a highly reliable light-emitting device having a sealing material of which manufacturing cost is suppressed.

(1) According to one embodiment of the invention, a light-emitting device comprises:

a light-emitting element; and a sealing material for sealing the light-emitting element, wherein the sealing material comprises a first layer comprising a radical polymerizable resin and a second layer comprising a non-radical polymerizable resin, the first layer being in contact with the light-emitting element and the second layer covering an upper surface of the first layer.

In the above embodiment (1) of the invention, the following modifications and changes can be made.

(i) The non-radical polymerizable resin comprises a thermosetting resin.

(ii) The non-radical polymerizable resin comprises a non-radical polymerizable silicone resin.

(iii) The non-radical polymerizable resin comprises a non-radical polymerizable epoxy resin.

(iv) A thickness of the thinnest portion of the first layer is greater than a thickness of the thickest portion of the second layer.

(v) The light-emitting device further comprises a case covering an entirety of a side surface and a bottom face of the first layer of the sealing material.

(vi) The non-radical polymerizable resin of the second layer comprises one of a resin containing a benzene ring and a resin containing an alicyclic skeleton.

(vii) The non-radical polymerizable resin of the second layer comprises one of phenyl silicone and organic-modified silicone.

(viii) The light-emitting device further comprises a bonding wire to feed the light-emitting element therethrough, wherein the bonding wire is entirely enclosed in the first layer of the sealing material.

(ix) The second layer has a thickness of 20 μm to 500 μm.

Points of the Invention

According to one embodiment of the invention, a light-emitting device is constructed such that the first layer of the sealing material is formed of a radical polymerizable resin and the second layer formed of a non-radical polymerizable resin is formed to cover the upper surface of the first layer. With the first layer formed of the radical polymerizable resin, it is possible to reduce the waste amount of the resin material since it is stable at a room temperature. In addition, the second layer of the non-radical polymerizable resin can suppress the insufficient curing of the first layer since it blocks the permission of oxygen.

BRIEF DESCRIPTION OF THE DRAWINGS

Next, the present invention will be explained in more detail in conjunction with appended drawings, wherein:

FIG. 1 is a vertical cross-sectional view showing a light-emitting device in an embodiment.

DESCRIPTION OF THE PREFERRED EMBODIMENTS

Embodiment

FIG. 1 is a vertical cross-sectional view showing a light-emitting device in the embodiment. A light-emitting device 10 has a light-emitting element 2 mounted on a lead frame 1 and a sealing material 6 for sealing the light-emitting element 2. The lead frame 1, the light-emitting element 2 and the sealing material 6 are formed in a case 5.

The entire lead frame 1 or a surface thereof is formed of e.g., Ag, Cu or Al.

The light-emitting element 2 is, e.g., an LED chip, etc. Non-illustrated n- and p-electrodes of the light-emitting element 2 are connected to the lead frame 1 via wires 3 (wire bonding). In addition, the light-emitting element 2 is fixed to the lead frame 1 by a die bonding paste 4.

The light-emitting device 10 shown in FIG. 1 is a top-view type surface mount device using a face-up type LED chip as the light-emitting element 2, but may alternatively have another configuration such as side view type, bullet type or COB (Chip on Board) type. In addition, the light-emitting element 2 is not limited to a face-up type and may be, e.g., a flip-chip type.

The sealing material 6 has a first layer 6a which is formed of a radical polymerizable resin and is in contact with the light-emitting element 2 and a second layer 6b which is formed of a non-radical polymerizable resin and covers an upper surface of the first layer 6a.

A radical polymerizable resin and a non-radical polymerizable resin each in a liquid form are sequentially potted in the case 5 and are subsequently cured by heating, thereby forming the first layer 6a and the second layer 6b. Here, the non-radical polymerizable resin of the second layer 6b is injected in the state that the radical polymerizable resin of the first layer 6a is not completely cured and the both resins are then cured, thereby allowing adhesion between the first layer 6a and the second layer 6b to be enhanced.

The radical polymerizable resin constituting the first layer 6a is, e.g., Aronix manufactured by Toagosei Co., Ltd. or Diallyl Phthalate (DAP) manufactured by Daiso Co., Ltd. Benzoyl peroxide or dicumyl peroxide, etc., is added as an initiator of radical polymerization. Note that, the first layer 6a may be formed of two or more types of radical polymerizable resins.

Since the radical polymerizable resin is stable at room temperature (e.g., 25° C.) and is instantaneously and progressively polymerized and cured at a high temperature, it is less likely to be cured before being poured into the case 5 and it is possible to suppress a waste amount. In addition, since polymerization reaction in the radical polymerizable resin can be effectively and instantaneously completed at a high temperature, change in characteristics of the first layer 6a due to progress of the reaction does not occur when the light-emitting device 10 is activated and it is thus possible to improve reliability of the light-emitting device 10.

Meanwhile, although cure inhibition caused by oxygen is likely to occur at a surface of the radical polymerizable resin in contact with the air, it is possible to suppress contact between the first layer 6a formed of the radical polymerizable resin and the air in the present embodiment since the upper surface of the first layer 6a is covered with the second layer 6b. Accordingly, elimination of oxygen by flowing an inert gas such as nitrogen gas into a hardening furnace is not required at the time of forming the first layer 6a, which allows the manufacturing cost to be suppressed. Note that, since side and bottom surfaces of the first layer 6a are covered by the case 5, there is nearly no risk of coming into contact with oxygen.

The non-radical polymerizable resin constituting the second layer 6b is, e.g., a non-radical polymerizable silicone resin or a non-radical polymerizable epoxy resin. Alternatively, an epoxy/silicone hybrid resin having an epoxy group in the silicone backbone may be used. Note that, the second layer 6b may be formed of two or more types of non-radical polymerizable resins.

Although the second layer 6b can be formed of a thermoplastic resin, it is more preferable to use a thermosetting resin than to use a thermoplastic resin since it is easy to handle.

In addition, the non-radical polymerizable resin constituting the second layer 6b is preferably formed of a resin having high gas barrier properties in order to prevent permeation of oxygen and to thereby suppress contact of oxygen with the first layer 6a formed of the radical polymerizable resin. As the resin having high gas barrier properties, it is possible to use, e.g., a resin containing a benzene ring or a resin containing an alicyclic skeleton.

Among non-radical polymerizable silicone resins, for example, phenyl silicone and organic-modified silicone have higher gas barrier properties than dimethyl silicone and are better as the material of the second layer 6b since yellowing is less caused by heat or light. In addition, the non-radical polymerizable epoxy resin has higher gas barrier properties than the non-radical polymerizable silicone resin and is better as the material of the second layer 6b.

In the present embodiment, even a non-radical polymerizable resin, which cannot be used to form the entire sealing material 6 due to viscosity which increases to some extent at room temperature, can be used to form the second layer 6b as a part of the sealing material 6. Therefore, it is possible to suppress the waste amount of the non-radical polymerizable resin. This is because, for example, a decrease in a resin injection rate due to an increase in viscosity has less impact since the second layer 6b is much thinner than the entire sealing material 6 and an injected amount of the resin is small, and also, it is possible to easily embed the resin even if viscosity of the resin is high (voids, etc., are less likely to be generated) since a region of the first layer 6a in which the second layer 6b is formed has a more gently sloped shape than the inner shape of the case 5.

A thickness of the thinnest portion of the first layer 6a (e.g., a thickness at the center) is larger than a thickness of the thickest portion of the second layer 6b (e.g., a thickness at the center). This is to reduce the waste amount of the resin and to improve reliability of the light-emitting device 10 by forming the most part of the sealing material 6 from the first layer 6a made of the radical polymerizable resin. In addition, since the thinner second layer 6b makes embedment of resin easier and also allows the non-radical polymerizable resin with viscosity increased to some extent at room temperature to be used as a material of the second layer 6b as described above, it is possible to reduce the waste amount of the resin. In addition, since the second layer 6b is thin and the injected amount of the resin is small, it is possible to form the second layer 6b by printing a liquid-form resin before curing or by attaching a film-form resin on/to the first layer 6a.

In addition, it is preferable that the wire 3 be not in contact with an interface between the first layer 6a and the second layer 6b. In other words, it is preferable that the entire wire 3 be present in the first layer 6a. This is because, when the wire 3 is in contact with the interface between the first layer 6a and the second layer 6b, damages may be caused by stress generated at the interface.

The thickness of the second layer 6b is preferably not less than 20 μm and not more than 500 μm. This is because it may not be possible to effectively suppress contact of oxygen with the upper surface of the first layer 6a when the thickness of the second layer 6b is smaller than 20 μm and, when greater than 500 μm, viscosity characteristics of the non-radical polymerizable resin constituting the second layer 6b is limited due to time required for a manufacturing process, which decreases the degree of freedom of choosing a resin used for the second layer 6b.

The sealing material 6 may contain a phosphor. In addition, a dispersant for dispersing the phosphor may be contained therein. The phosphor may be dispersed in the sealing material 6 or may be settled at the bottom of the recessed portion of the case 5.

In addition, the sealing material 6 may contain a filler. A filler content is not specifically limited. The filler is preferably excellent in heat resistance from the viewpoint of manufacturing conditions or performance of the light-emitting device 10 and can be preferably used under the temperature condition of, e.g., not less than 150° C. In addition, the filler in which yellowing is less caused by heat or light is preferable. It is possible to use a transparent filler such as silica, silicone, glass beads or glass fiber, etc., or a white filler such as titanium oxide or potassium titanate, etc. The shape of the filler is not limited and is, e.g., a granular shape, a spherical shape, a scale-like shape, a rod-like shape or a fiber shape. As a reflective material, it is preferable to use a white filler or multiple fillers having different refractive indices and it is particularly preferable to use titanium oxide or potassium titanate in view of heat resistance, light resistance and reflectivity.

Effects of the Embodiment

In the present embodiment, the first layer 6a constituting the most part of the sealing material 6 is formed of the radical polymerizable resin and it is thereby possible to reduce the waste amount of the resin material and also to improve reliability of the light-emitting device 10. In addition, the second layer 6b made of the non-radical polymerizable resin which is formed to cover the upper surface of the first layer 6a allows insufficient curing of the first layer 6a to be suppressed.

The present invention is not intended to be limited to the above-mentioned embodiment, and the various kinds of modifications can be implemented without departing from the gist of the invention.

In addition, the invention according to claims is not to be limited to the above-mentioned embodiment. Further, it should be noted that all combinations of the features described in the embodiment are not necessary to solve the problem of the invention.

What is claimed is:

1. A light-emitting device, comprising:
   a light-emitting element; and
   a sealing material for sealing the light-emitting element,
   wherein the sealing material comprises a first layer comprising a radical polymerizable resin as a matrix material and a second layer comprising a non-radical polymerizable resin, the first layer being in contact with the light-emitting element and the second layer covering an upper surface of the first layer, and
   wherein the radical polymerizable resin comprises a material other than a silicone resin and an epoxy resin.

2. The light-emitting device according to claim 1, wherein the non-radical polymerizable resin comprises a thermosetting resin.

3. The light-emitting device according to claim 2, wherein the non-radical polymerizable resin comprises a non-radical polymerizable silicone resin.

4. The light-emitting device according to claim 3, wherein a thickness of a thinnest portion of the first layer is greater than a thickness of a thickest portion of the second layer.

5. The light-emitting device according to claim 2, wherein the non-radical polymerizable resin comprises a non-radical polymerizable epoxy resin.

6. The light-emitting device according to claim 1, further comprising:
   a case,
   wherein the case covers an entirety of a side surface and a bottom face of the first layer of the sealing material.

7. The light-emitting device according to claim 1, wherein the non-radical polymerizable resin of the second layer comprises one of a resin containing a benzene ring and a resin containing an alicyclic skeleton.

8. The light-emitting device according to claim 1, wherein the non-radical polymerizable resin of the second layer comprises one of phenyl silicone and organic-modified silicone.

9. The light-emitting device according to claim 1, further comprising:
   a bonding wire to feed the light-emitting element therethrough,
   wherein the bonding wire is entirely enclosed in the first layer of the sealing material.

10. The light-emitting device according to claim 1, wherein the second layer has a thickness of 20 μm to 500 μm.

11. The light-emitting device according to claim 1, wherein the first layer comprises a resin substantially consisting of the radical polymerizable resin.

12. The light-emitting device according to claim 1, wherein the second layer is formed on an upper surface of the first layer, and forms a gas barrier which prevents oxygen from contacting the surface of the first layer.

13. The light-emitting device according to claim 1, wherein the first layer comprises a plurality of types of radical polymerizable resins.

14. The light-emitting device according to claim 1, wherein the second layer comprises a plurality of types of non-radical polymerizable resins.

15. The light-emitting device according to claim 1, wherein the non-radical polymerizable resin comprises an epoxy and silicone hybrid resin.

16. The light-emitting device according to claim 1, wherein the second layer covers an entirety of the first layer.

17. The light-emitting device according to claim 1, wherein a thickness of the first layer is greater than a thickness of the second layer.

18. The light-emitting device according to claim 1, wherein the radical polymerizable resin comprises a resin in which radical polymerization is initiated by adding an initiator.

19. The light-emitting device according to claim 1, wherein the radical polymerizable resin is stable at room temperature.

* * * * *